(12) United States Patent
Lim et al.

(10) Patent No.: US 7,864,556 B2
(45) Date of Patent: Jan. 4, 2011

(54) MAGNETIC DOMAIN INFORMATION STORAGE DEVICE AND METHOD OF MANUFACTURING THE SAME

(75) Inventors: Chee-kheng Lim, Yongin-si (KR); Sung-hoon Choa, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/987,925

(22) Filed: Dec. 6, 2007

(65) Prior Publication Data

US 2008/0137406 A1  Jun. 12, 2008

(30) Foreign Application Priority Data

Dec. 6, 2006  (KR) .................... 10-2006-0123368

(51) Int. Cl.
*G11C 19/00* (2006.01)

(52) U.S. Cl. .................... 365/81; 365/87; 365/148; 365/158; 365/171; 977/933; 438/3

(58) Field of Classification Search ......... 365/171–173, 365/158, 131, 66, 80–93, 48, 55, 62, 74, 365/78, 100, 130, 148, 225.5, 243.5; 257/421, 257/E21.665; 438/3; 977/933–935; 216/22
See application file for complete search history.

(56) References Cited

U.S. PATENT DOCUMENTS

| | | | |
|---|---|---|---|
| 6,834,005 B1* | 12/2004 | Parkin ........................ | 365/80 |
| 2004/0033515 A1* | 2/2004 | Cao et al. ..................... | 435/6 |
| 2005/0018478 A1* | 1/2005 | Nagase et al. ............... | 365/171 |
| 2005/0045581 A1* | 3/2005 | Suwa et al. .................. | 216/22 |
| 2005/0078509 A1* | 4/2005 | Parkin ........................ | 365/158 |
| 2005/0078511 A1* | 4/2005 | Parkin ........................ | 365/171 |
| 2005/0124092 A1* | 6/2005 | Bona et al. .................. | 438/107 |
| 2005/0186686 A1* | 8/2005 | Chen et al. .................... | 438/3 |
| 2006/0120132 A1* | 6/2006 | Parkin ........................ | 365/80 |
| 2007/0278603 A1* | 12/2007 | Ochiai et al. ................ | 257/421 |
| 2008/0080092 A1* | 4/2008 | Kim .......................... | 360/110 |
| 2008/0080234 A1* | 4/2008 | Iwata et al. ................. | 365/171 |

OTHER PUBLICATIONS

Magnetically Engineered Spintronic Sensors and Memory, by S. Parkin et al., Proceedings of the IEEE, Vol. 91, No. 5, May 2003, pp. 661-680.*
W. Zhang and S. Y. Chou, Fabrication of 60-nm transistors on 4-in. wafer using nanoimprint at all lithography levels, Applied Physics Letters, vol. 83, No. 8, Aug. 25, 2003, pp. 1632-1634.*
Chinese Office Action dated May 12, 2010 for corresponding Application No. 200710303536.0 and English language translation thereof.

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

Example embodiments may provide magnetic domain information storage devices with trenches and a method of manufacturing the information storage device. Example embodiment information storage devices may include a magnetic layer on a substrate having a plurality of magnetic domains and a power unit for moving magnetic domain walls. Magnetic layers may be parallel to the substrate, and a plurality of trenches in the magnetic layer may be perpendicular to the substrate. Portions of a lower surface of the magnetic layer corresponding to trenches may protrude downward.

19 Claims, 5 Drawing Sheets

US 7,864,556 B2

MAGNETIC DOMAIN INFORMATION STORAGE DEVICE AND METHOD OF MANUFACTURING THE SAME

PRIORITY STATEMENT

This application claims benefit under 35 U.S.C. §119 to Korean Patent Application No. 10-2006-0123368, filed on Dec. 6, 2006 in the Korean Intellectual Property Office, the disclosure of which is incorporated herein in its entirety by reference.

BACKGROUND

1. Field

Example embodiments may relate to information storage devices, for example, to information storage devices that use magnetic domain wall movement and/or methods of fabricating information storage devices.

2. Description of the Related Art

Non-volatile information storing devices include a hard disc drive (HDD) and a random access memory (RAM).

A general HDD is a device that may read and/or write information by rotating a magnetic recording medium in disk form and/or moving a reading/writing head above a magnetic recording medium. HDDs are non-volatile data storage devices that may be capable of storing 100 gigabytes (GB) of data or more and may be used as a storage device in computers.

A HDD may include moving mechanical systems. These mechanical systems may cause various mechanic faults if the HDD is moved or shocked, thereby decreasing mobility and/or reliability of the HDD. These mechanical systems may increase manufacturing complexity and/or costs of the HDD, increase power consumption, and/or generate noise. If HDDs are reduced in size, these problems associated with manufacturing complexity and cost may increase.

A flash memory, which is widely used, is an example of non-volatile RAM. However, the flash memory has drawbacks of slow reading and writing speeds and short life span. Due to the drawbacks of flash memory, new memory devices such as ferroelectric random access memory (FRAM), magnetic random access memory (MRAM), and phase change random access memory (PRAM) have been developed in limited numbers and a few have been commercialized. However, because flash memory, FRAM, MRAM, and PRAM all include a switching device in their each memory cell, it may be difficult to reduce the memory cell area. Also, these memories may have smaller storage capacities when compared to a HDD.

Therefore, as a method of solving the drawbacks of the conventional non-volatile information storing devices described above, research for developing new storage devices that are capable of storing larger amounts of data while not including moving mechanical systems and switching devices has been carried out. As an example of the new storage devices, an information storage device using magnetic domain wall movement was proposed.

Magnetic regions that make up a magnetic body may be called magnetic domains. A single magnetic domain has identical direction of magnetic moment. Size and magnetization direction of magnetic domains may depend on the property, shape, size of a magnetic material and on external energy.

A magnetic domain wall may be a boundary between magnetic domains having different magnetization directions and may be moved by a current and/or a magnetic field applied to a magnetic material. A plurality of magnetic domains having one magnetization direction may be formed in a magnetic layer of a desired width and thickness, and magnetic domains and magnetic domain walls may be moved using a current and/or magnetic field.

Applying the principle of moving magnetic domain walls to information storage devices, magnetic domains may be passed through pinned reading/writing heads by movement of a magnetic domain wall, thereby enabling reading/writing without rotation of recording medium.

Information storage devices using movement of a magnetic domain wall may store a larger amount of data and may not require moving mechanical systems, thereby having increased mobility and/or reliability, being more easily manufactured, and having lower power consumption.

In order to successfully operate information storage devices using movement of a magnetic domain wall, magnetic domain wall movement may need to be more stable.

To secure stability of a magnetic domain wall movement bit by bit, an example method of forming notches at a side of a magnetic layer, for example, forming lateral notches, may be used. Magnetic domain walls moving due to a current pulse at or above a critical value may be stopped at lateral notches. Magnetic domain walls may be moved by one bit at a time by a plurality of lateral notches formed uniformly at the magnetic layer.

It may be difficult to form fine-sized notches at a side of a magnetic layer, which may have a width of only several tens of nanometers. For example, if notches are formed at both sides of a magnetic layer having a width of about 50 nm, notches may be formed to have a width of about 15 nm, one third of the width of the magnetic layer. It may be difficult to realize such fine lateral notches by an exposure and etching technique. It may be difficult to form fine lateral notches to have uniform interval, size, and shape. If interval, size, and/or shape of lateral notches are not uniform, intensity of a magnetic field stopping the magnetic domain wall, for example, intensity of the pinning magnetic field may vary, and reliability of example information storage device may be lowered. Thus, it may be difficult to fabricate an information storage device including lateral notches using related art techniques.

SUMMARY

Example embodiments may provide magnetic domain manipulating information storage devices with more easily formed lateral notches, increased uniformity of device characteristics, and/or increased stability of bit-by-bit magnetic domain wall movement.

Example embodiments may also provide methods of manufacturing information storage devices.

Example embodiments may include an information storage device including a magnetic layer formed on a substrate. The magnetic layer may include magnetic domains and/or a unit applying energy to the magnetic layer for moving magnetic domain walls. The magnetic layer may be parallel to the substrate, trenches may be perpendicular to the substrate, and portions of a lower surface of the magnetic layer corresponding to the trenches may protrude downward from the lower surface of the magnetic layer.

Example information storage devices may have trenches across a magnetic layer at equivalent intervals. Width of the trenches may decrease with depth, and the trenches may be V-shaped. For example, the depth of the trenches may be about 2 nm to about 50 nm, and an interval between trenches may be about 5 nm to about 1000 nm. Width of the trenches at a top surface of the magnetic layer may be about 2 nm to about 250 nm. Corresponding trenches may be in the substrate at positions corresponding to the trenches in the magnetic layer. Width of the corresponding trenches in the substrate may decrease with depth.

Example methods may include a method of manufacturing an information storage device that uses magnetic domain wall movement and includes a magnetic layer on a substrate having magnetic domains and a unit applying energy to the magnetic layer for moving magnetic domain walls. Example methods may include forming a plurality of trenches in the substrate and forming a magnetic layer on the substrate in which the trenches may be formed. The magnetic layer may be formed such that the upper surface of the magnetic layer and the trenches have a similar shape.

Trenches in the substrate may be formed by stamping the substrate using a master stamp with protrusions protruding from a lower surface of the master stamp and removing the master stamp. The width of the protrusions may decrease with depth. Trenches may be formed using a nano imprinting method or the like.

Trenches may be formed perpendicularly to the substrate in the magnetic layer. The width of trenches formed in the magnetic layer may decrease with depth, and trenches formed in the magnetic layer may be V-shaped.

BRIEF DESCRIPTION OF THE DRAWINGS

The above and/or other features and advantages of example embodiments may become more apparent by describing them with reference to the attached drawings in which.

DETAILED DESCRIPTION

Figure 1:
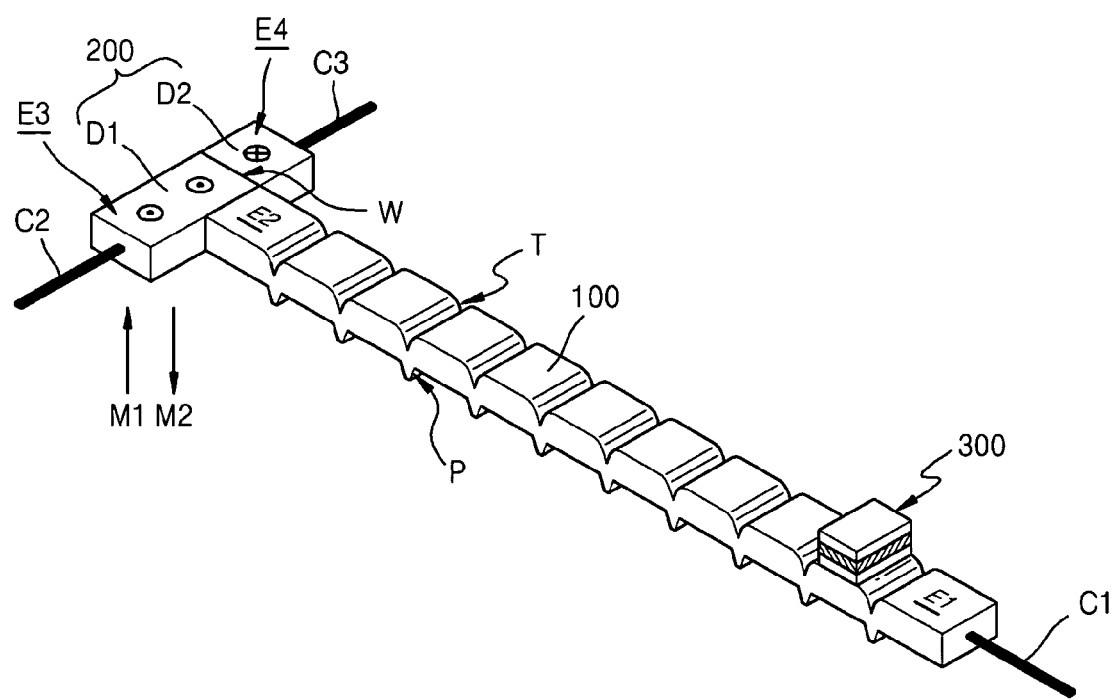
FIG. 1 is an isometric view illustrating an example embodiment information storage device that uses magnetic domain wall movement.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view illustrating an example embodiment information storage device using movement of a magnetic domain wall.

As shown in FIG. 1, example embodiment information storage devices may include a magnetic layer 100 on a substrate (not shown) and having a plurality of magnetic domains. The magnetic layer 100 may be a storage track in which data may be stored. The magnetic layer 100 may be parallel to the substrate, and a plurality of trenches T perpendicular to the substrate may be in the magnetic layer 100. Portions of a lower surface of the magnetic layer 100 corresponding to the trenches T protrude downward. The pinning position of magnetic domain walls may be controlled in the magnetic layer 100 by the trenches T. Stability of bit-by-bit movement of the magnetic domain walls may be increased by the trenches T. The magnetic layer 100 including the trenches T will be described in more detail later.

A first conductive line C1 may be connected to a first end E1 of the magnetic layer 100.

A second end E2 of the magnetic layer 100 may be adjacent to a writer 200 for recording data to the magnetic layer 100. The writer 200 may be a ferromagnetic layer including two magnetic domains magnetized in opposite directions; that is, first and second magnetic domains D1 and D2. The magnetic layer 100 and the writer 200 may be formed perpendicularly to each other in the same plane. In FIG. 1, ⊙ denotes magnetization in a first direction M1, and ⊗ denotes magnetization in a second direction M2 that is opposite to the first direction M1.

Second and third conductive lines C2 and C3 are formed, which may be respectively connected to first and second ends E3 and E4 of the writer 200. If a current is applied to the writer 200 through the second and third conductive lines C2 and C3, a magnetic domain wall W, which is the boundary between the first and second magnetic domains D1 and D2, may be moved. The magnetic domain wall W may be moved in the same direction as electron movement; that is, in the opposite direction to the current. The size of the magnetic domains D1 and D2 may be changed according to the movement of the magnetic domain wall W. As illustrated in FIG. 1, as the first magnetic domain D1 extends to the portion of the writer 200 adjacent to the magnetic layer 100 and a current is applied to the first end E3 of the writer 200 from the first end E1 of the magnetic layer 100, the first magnetic domain D1 may extend to the second end E2 of the magnetic layer 100. Data corresponding to the first direction M1, for example, '0,' may be recorded to the second end E2 of the magnetic layer 100. If the second magnetic domain D2 extends to the portion of the writer 200 adjacent to the magnetic layer 100 and a current is applied to the second end E4 of the writer 200 from the first end E1 of the magnetic layer 100, the second magnetic domain D2 may extend to the second end E2 of the magnetic layer 100. Data corresponding to the second direction M2, for example, '1', may be recorded to the second end E2 of the magnetic layer 100. Example embodiment information storage devices may accordingly move magnetic domains and magnetic domain walls bit-by-bit in the magnetic layer 100 and the writer 200 to record data to the magnetic layer 100.

A reader 300 for reading data recorded to the magnetic layer 100 may be in a region of the magnetic layer 100. The reader 300 may be a tunnel magneto resistance (TMR) reading head or a giant magneto resistance (GMR) reading head that is commonly used in magnetic recording type information storage devices. A reading current may be applied between the first end E1 of the magnetic layer 100 and the reader 300. In this case, the electric resistance between the first end E1 of the magnetic layer 100 and the reader 300 may vary according to the magnetization direction of the magnetic domain of the magnetic layer 100 below the reader 300.

The structure and the position of the writer 200 and the reader 300 in example embodiment information storage devices may be modified. For example, the writer 200 may be a TMR and/or GMR writing head using spin torque of electrons and/or a writing head using an external magnetic field.

The magnetic layer 100 including the trenches T and a method of forming the same will be described in detail.

The trenches T may be formed at equivalent intervals across the magnetic layer 100. The trenches T may be V shaped. The depth of the trenches T may be about 2 nm to about 50 nm, the interval between the trenches T may be about 5 to about 1000 nm, and the width of the trenches T at the top surface of the magnetic layer 100 may be about 2 nm to about 250 nm. Other trenches may be in a position corresponding to the trenches T on the substrate, and protrusions P corresponding to the trenches T may protrude downward from a bottom surface of the magnetic layer 100. The thickness of the magnetic layer 100 may be uniform, regardless of the trenches T or portions where no trenches are formed.

FIGS. 2A through 2I are cross-sectional views illustrating an example method of forming the magnetic layer 100 included in the information storage device of FIG. 1. FIGS. 2A through 2E illustrate an example method of forming a master stamp, and FIGS. 2F through 2I illustrate an example method of forming the magnetic layer 100 using the master stamp.

Figure 2A:
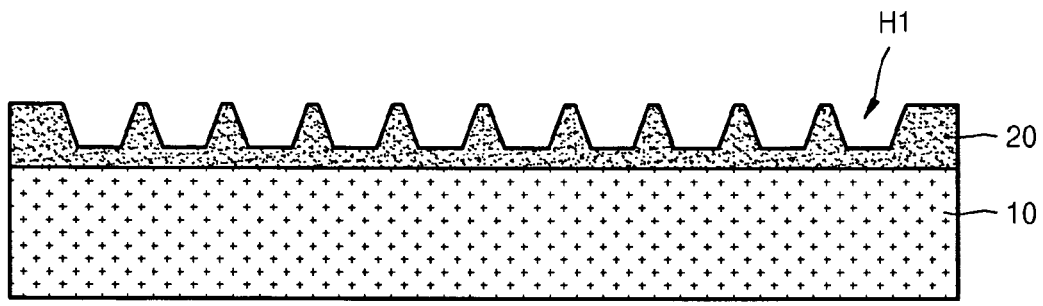
FIGS. 2A through 2I are cross-sectional views illustrating an example method of forming a magnetic layer included in an information storage device that uses movement of a magnetic domain wall.

As shown in FIG. 2A, a photosensitive material may be coated on a molding plate 10, and the photosensitive material may be patterned using a related art method, for example, using E-beam lithography and/or another suitable process to form a patterned photosensitive layer 20. A plurality of grooves H1 may be formed in the patterned photosensitive layer 20, and side walls of the grooves H1 may be inclined.

Figure 2B:
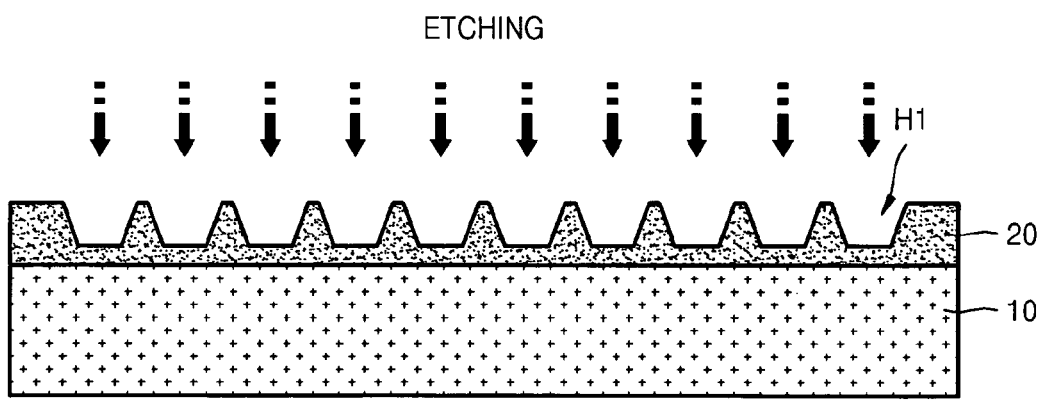

As shown in FIG. 2B, the entire surface of the patterned photosensitive layer 20 and/or the molding plate 10 may be etched.

Figure 2C:
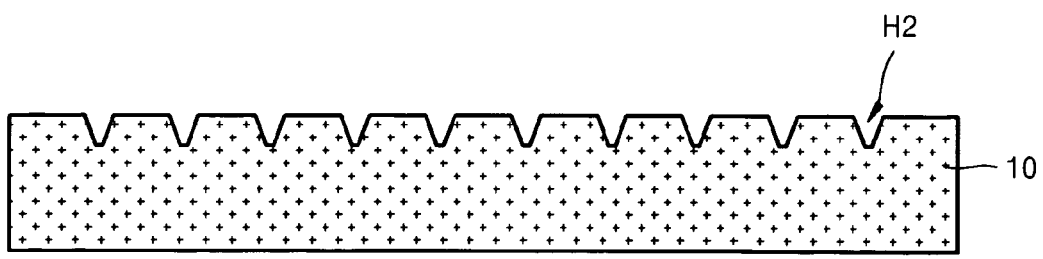

Portions of the molding plate 10 under portions of the patterned photosensitive layer 20 corresponding to the grooves H1 may be etched deeper. FIG. 2C shows the result of etching the entire surface of the patterned photosensitive layer 20 and/or the molding plate 10.

As shown in FIG. 2C, the patterned photosensitive layer 20 may be removed by the etching process, and nano-sized second grooves H2 may be formed in the molding plate 10. The width of the second grooves H2 may be reduced in a downward direction because the molding plate 10 may be inclined while being etched during the above-described etching process. The angle of the inclination of sides of the second grooves H2 may be controlled by the etching conditions.

Figure 2D:
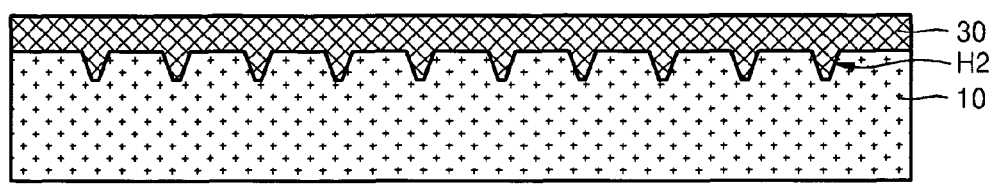

As shown in FIG. 2D, a stamp layer 30 may be formed on the molding plate 10 to fill the second grooves H2.

Figure 2E:
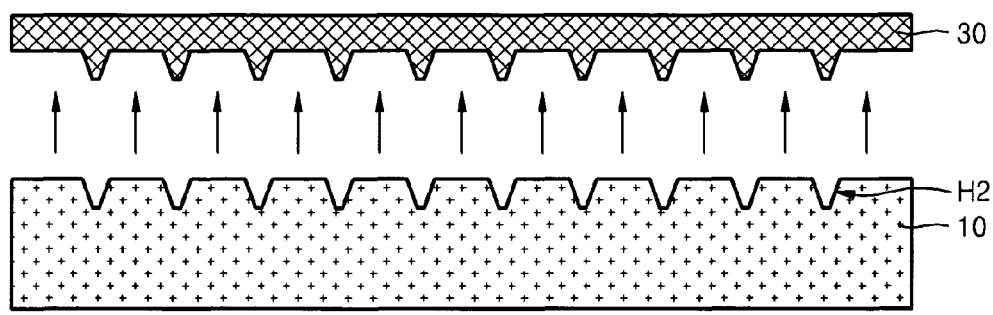

As shown in FIG. 2E, the stamp layer 30 may be separated from the molding plate 10. The separated stamp layer 30 may now act as a master stamp.

Figure 2F:
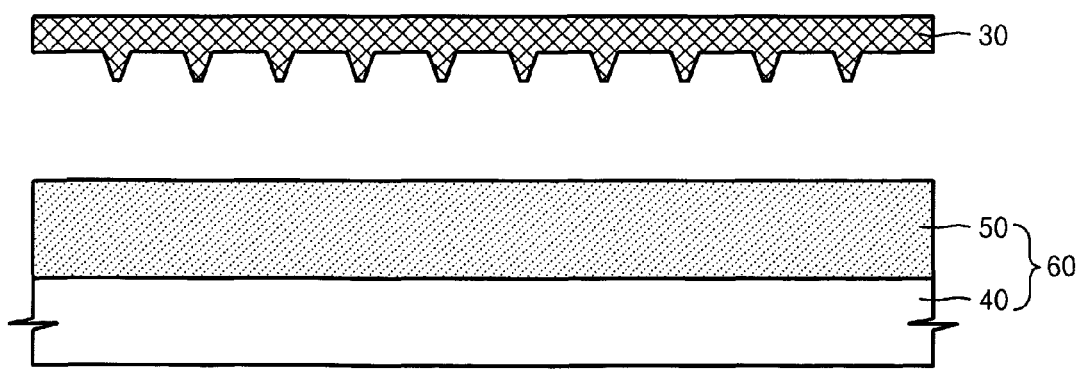

As shown in FIG. 2F, a substrate 60, which may include a supporting substrate 40 and a resin layer 50 sequentially stacked, may be provided, and the master stamp 30 may be located above the substrate 60.

Figure 2G:
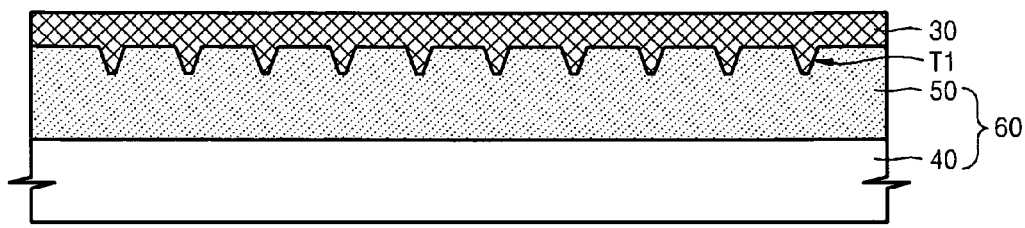

As shown in FIG. 2G, the substrate 60 may be imprinted using the master stamp 30, thereby nano-patterning the substrate 60. First trenches T1 may be formed in the substrate 60 because of the imprinting.

Figure 2H:
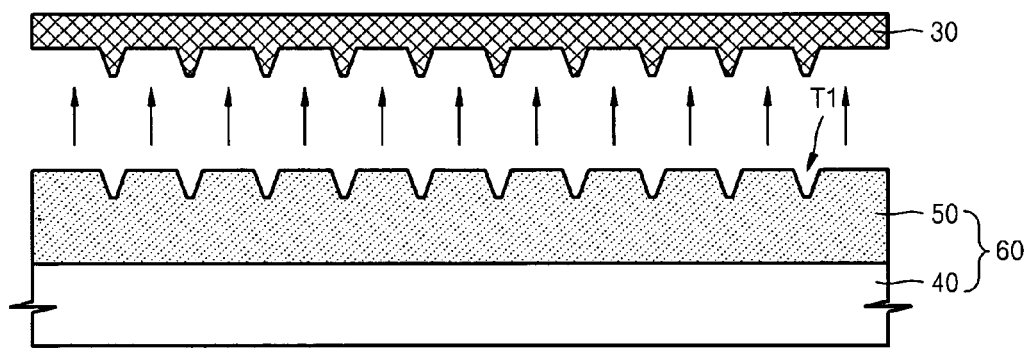

As shown in FIG. 2H, the master stamp 30 may be separated from the substrate 60. The master stamp 30 may be used several times on subsequent substrates.

Figure 2I:
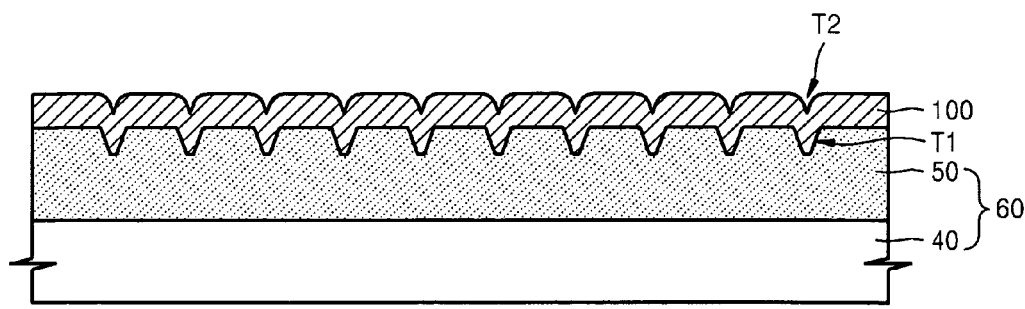

As shown in FIG. 2I, a magnetic layer 100 may be formed on the top surface of the substrate 60 in which the first trenches T1 are formed. The magnetic layer 100 may fill the first trenches T1 on the substrate 60. A plurality of second trenches T2 may be formed perpendicularly to the substrate 60 in the magnetic layer 100, and portions of a lower surface of the magnetic layer 100 corresponding to the second trenches T2 may protrude downward. The second trenches T2 may be the trenches T of FIG. 1.

Though not illustrated in FIG. 2I, a writer may be formed together while forming the magnetic layer 100, and a reader may be formed in a region of the magnetic layer 100 after forming the magnetic layer 100. In this way an information storage device including the magnetic layer 100 may be manufactured.

Example embodiment information storage devices may be manufactured using other methods than the nano imprinting method using the master stamp 30. For example, instead of imprinting the resin layer 50 using the master stamp 30, the resin layer 50 may be etched using E-beam lithography, lithography using ultraviolet or laser interference, nano sphere lithography using nano particles, and/or another suitable related art method. A plurality of trenches may be accordingly formed on the resin layer 50. A magnetic layer filling the trenches may then be formed on the resin layer 50.

Figure 3:
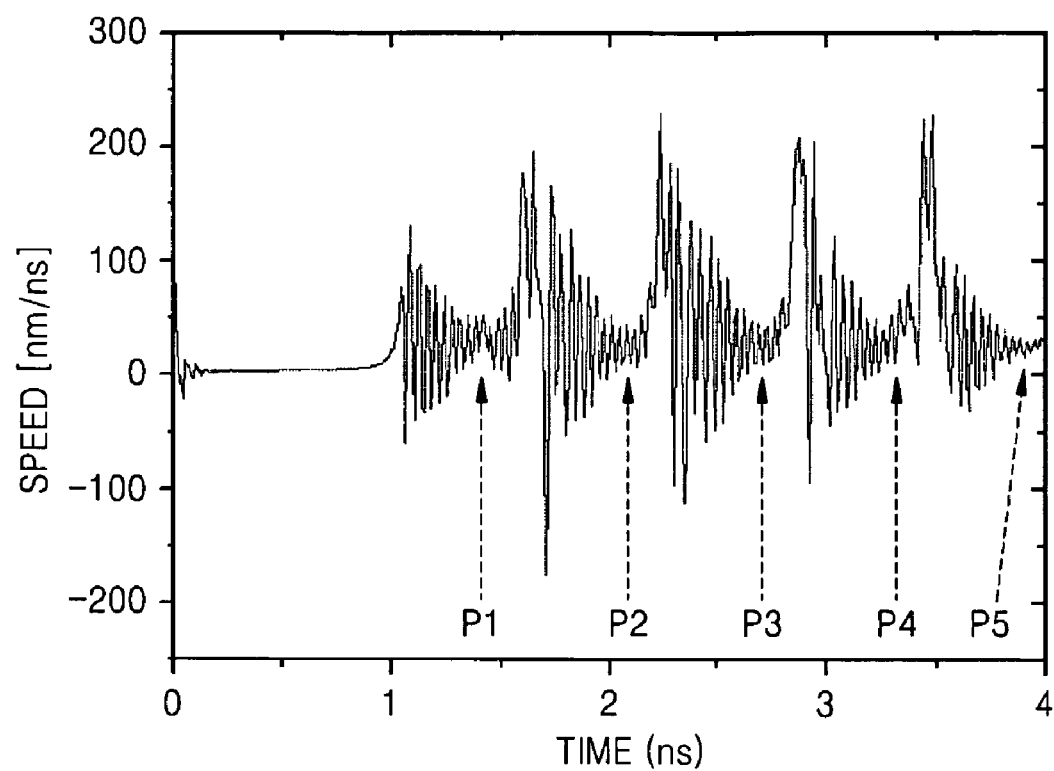
FIG. 3 is a graph illustrating the variation of the moving speed of magnetic domain walls versus time when the magnetic domain walls in the magnetic layer are moved by applying a magnetic field to the magnetic layer in an example embodiment information storage device that uses magnetic domain walls movement.

FIG. 3 is a graph illustrating the variation of the moving speed of the magnetic domain walls in the magnetic layer 100 versus the time when the magnetic domain walls in the magnetic layer 100 may be moved by applying a magnetic field to the magnetic layer 100 in example embodiments.

As shown in FIG. 3, points P1 through P5 may be where the magnetic domain wall stops oscillating. The points P1 through P5 at which the moving speed of the magnetic domain wall nears 0 correspond to times when the wall approaches the position of the trenches T of FIG. 1. The magnitude of oscillation of the magnetic domain wall in the trenches T may be lower at these points. Thus the magnetic domain walls may be easily set in the trenches T. Stability of bit-by-bit movement of the magnetic domain wall in the magnetic layer 100 may be increased by the trenches T. It can be seen from the graph of FIG. 3 that the moving speed of the magnetic domain wall may range from positive (+) to negative (−) values because the magnetic domain wall may be oscillating, and this oscillation may a unique characteristic of a magnetic domain wall.

As described above, it may be more difficult to form lateral notches in a magnetic layer to which data is to be recorded as related art information storage devices are increasingly integrated. Example embodiments may provide fine trenches T formed perpendicularly to the substrate 60 more easily formed in the magnetic layer 100 using the above-described nano imprinting method. The magnetic layer 100 may have a uniform thickness while having the trenches T formed perpendicularly to the substrate 60, and thus the size of the trenches T may not need to be reduced even though the width and/or thickness of the magnetic layer 100 is reduced due to the higher integration of the information storage device. Stability of bit-by-bit movement of magnetic domain wall of example embodiment information storage devices may be increased.

As described above, a magnetic layer having fine trenches formed perpendicularly to a substrate 60 and having uniform thickness may be formed using a nano imprinting method. The trenches may reduce the oscillation magnitude of a magnetic domain wall moving in the magnetic layer, thereby potentially stabilizing bit-by-bit movement of the magnetic domain wall. Example embodiment information storage devices having higher recording density and reliability may be manufactured without the difficulty of forming lateral notches and risk of non-uniformity of device characteristics.

While example embodiments have been particularly shown and described with reference to included figures, it will be understood by those of ordinary skill in the art that various changes in form and details may be made therein without departing from the spirit and scope of the following claims.

What is claimed is:

1. An information storage device comprising:
    a substrate extending in a first direction and including a plurality of substrate trenches extending substantially perpendicular to the first direction;
    a magnetic layer extending in the first direction on the substrate, the magnetic layer including a plurality of magnetic domains separated by a plurality of movable magnetic domain walls, the magnetic layer including a plurality of magnetic layer trenches corresponding to the plurality of substrate trenches, a lower surface of the magnetic layer protruding downward under each of the plurality of magnetic layer trenches into a corresponding one of the plurality of substrate trenches; and
    a power unit configured to move the movable magnetic domain walls.

2. The information storage device of claim 1, wherein the plurality of magnetic layer trenches are at equivalent intervals.

3. The information storage device of claim 1, wherein the plurality of magnetic layer trenches narrow with depth.

4. The information storage device of claim 1, wherein the plurality of magnetic layer trenches are V-shaped.

5. The information storage device of claim 1, wherein the depth of the plurality of magnetic layer trenches is about 2 nm to about 50 nm.

6. The information storage device of claim 2, wherein the equivalent intervals are about 5 nm to about 1000 nm.

7. The information storage device of claim 1, wherein the plurality of magnetic layer trenches have a maximum width of about 2 nm to about 250 nm.

8. The information storage device of claim 3, wherein the plurality of substrate trenches narrow with depth.

9. A method of manufacturing a magnetic domain information storage device with trenches, the method comprising:
    forming a plurality of substrate trenches in a substrate; and
    forming a magnetic layer on the substrate such that the magnetic layer includes a plurality of magnetic layer trenches corresponding to the plurality of substrate trenches, and a lower surface of the magnetic layer protrudes downward under each of the plurality of magnetic layer trenches into a corresponding one of the plurality of substrate trenches.

10. The method of claim 9, wherein the forming of the plurality of substrate trenches includes forming the plurality of substrate trenches using a nano imprinting method.

11. The method of claim 9, wherein the forming of the plurality of substrate trenches includes stamping the substrate using a master stamp having a plurality of protrusions on a lower surface of the master stamp and removing the master stamp.

12. The method of claim 11, wherein the protrusions become narrower with depth.

13. The method of claim 9, wherein the plurality of magnetic layer trenches narrow with depth.

14. The method of claim 9, wherein the plurality of magnetic layer trenches are V-shaped.

15. An information storage device comprising:
    a substrate extending in a first direction;
    a magnetic layer extending in the first direction on the substrate, the magnetic layer including a plurality of magnetic domains separated by a plurality of movable magnetic domain walls, the magnetic layer including a plurality of magnetic layer trenches extending substantially perpendicular to the first direction, a lower surface of the magnetic layer protruding downward under each of the plurality of trenches; and
    a writer connected to a first end of the magnetic layer, the writer extending in a second direction perpendicular to the first direction and coplanar with the magnetic layer.

16. The information storage device of claim 15, further comprising:
    a first conductive line connected to a second end of the magnetic layer;
    a second conductive line connected to a first end of the writer; and
    a third conductive line connected to a second end of the writer.

17. The information storage device of claim 15, further comprising:
    a reader on a portion of the magnetic layer.

18. The information storage device of claim 15, wherein the writer includes a ferromagnetic layer having at least two magnetic domains magnetized in opposite directions.

19. The information storage device of claim 15, wherein the writer is directly connected to the first end.

* * * * *